(12) United States Patent
Zhu et al.

(10) Patent No.: US 8,710,556 B2
(45) Date of Patent: Apr. 29, 2014

(54) SEMICONDUCTOR DEVICE COMPRISING A FIN AND METHOD FOR MANUFACTURING THE SAME

(75) Inventors: Huilong Zhu, Poughkeepsie, NY (US);
Haizhou Yin, Poughkeepsie, NY (US);
Zhijiong Luo, Poughkeepsie, NY (US);
Qiagqing Liang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 250 days.

(21) Appl. No.: 12/937,652

(22) PCT Filed: Jun. 25, 2010

(86) PCT No.: PCT/CN2010/074497
§ 371 (c)(1),
(2), (4) Date: Aug. 1, 2011

(87) PCT Pub. No.: WO2011/079602
PCT Pub. Date: Jul. 7, 2011

(65) Prior Publication Data
US 2012/0038006 A1    Feb. 16, 2012

(30) Foreign Application Priority Data

Dec. 30, 2009  (CN) .......................... 2009 1 0244514

(51) Int. Cl.
*H01L 29/76* (2006.01)
*H01L 27/12* (2006.01)
*H01L 21/336* (2006.01)

(52) U.S. Cl.
USPC ................... 257/288; 257/347; 257/E29.255; 438/289

(58) Field of Classification Search
USPC ........... 257/67, 288, 347, 353, 355, 618, 619, 257/E29.255, E27.112, E23.132, E21.561
See application file for complete search history.

(56) References Cited

U.S. PATENT DOCUMENTS

2005/0110085 A1*  5/2005  Zhu et al. ...................... 257/347
2007/0132000 A1    6/2007  Hsu et al.
(Continued)

FOREIGN PATENT DOCUMENTS

CN          1933113 A       3/2007

OTHER PUBLICATIONS

Official Search Report and Written Opinion of the Patent Cooperation Treaty in counterpart Application No. PCT/CN2010/074497 filed Jun. 25, 2010.

*Primary Examiner* — Selim Ahmed
(74) *Attorney, Agent, or Firm* — Kinney & Lange, P.A.

(57) ABSTRACT

The present application discloses a semiconductor device comprising a fin of semiconductive material formed from a semiconductor layer over a semiconductor substrate and having two opposing sides perpendicular to the main surface of the semiconductor substrate; a source region and a drain region provided in the semiconductor substrate adjacent to two ends of the fin and being bridged by the fin; a channel region provided at the central portion of the fin; and a stack of gate dielectric and gate conductor provided at one side of the fin, where the gate conductor is isolated from the channel region by the gate dielectric, and wherein the stack of gate dielectric and gate conductor extends away from the one side of the fin in a direction parallel to the main surface of the semiconductor substrate, and insulated from the semiconductor substrate by an insulating layer. The semiconductor device has an improved short channel effect and a reduced parasitic capacitance and resistance, which contributes to an improved electrical property and facilitates scaling down of the transistor.

20 Claims, 13 Drawing Sheets

(56) References Cited

U.S. PATENT DOCUMENTS

| | | | |
|---|---|---|---|
| 2008/0001227 A1* | 1/2008 | Zhu et al. | 257/353 |
| 2008/0061370 A1* | 3/2008 | Matsuo | 257/347 |
| 2008/0197384 A1 | 8/2008 | Hartwich et al. | |
| 2008/0290391 A1* | 11/2008 | Hsu et al. | 257/315 |
| 2009/0065868 A1* | 3/2009 | Russ et al. | 257/351 |

* cited by examiner

SEMICONDUCTOR DEVICE COMPRISING A FIN AND METHOD FOR MANUFACTURING THE SAME

BACKGROUND OF THE INVENTION

1. Field of Invention

The present invention relates to a semiconductor device and a method for manufacturing the same, and in particular, to an improved FinFET formed on a semiconductor substrate.

2. Description of Prior Art

One important trend in the integrated circuits is scaling down of metal-oxide-semiconductor field effect transistors (MOSFETs) so as to achieve a high integration degree of devices and reduce the manufacturing costs. However, it is well known that short channel effect occurs with reducing the gate length of the MOSFET. When the size of the MOSFET is reduced, the gate of the MOSFET has a smaller effective gate length and actually, comparing a long gate length MOSFET, controls less charges in a depletion region with a given gate voltage, and the MOSFET has a reduced threshold voltage with a reduced channel length.

A conventional planar MOSFET has a tri-layer structure including a gate electrode, a semiconductor layer, and a gate dielectric sandwiched therebetween. A channel region is provided in the semiconductor layer below the gate electrode, and source/drain regions are provided in the semiconductor layer adjacent to and at two opposing sides of the channel region. A silicide layer may be provided on the source/drain regions and then coupled with source/drain electrodes through vias so as to reduce the parasitic resistance of the device. The planar MOSFET suffers from the short channel effect and has a threshold voltage fluctuating with variation of the channel length.

To suppress the short channel effect, U.S. Pat. No. 6,413,802 discloses a FinFET formed on a SOI substrate, comprising a channel region provided in the central portion of a fin of semiconductive material and source/drain regions provided at two ends of the fin. Gate electrodes are provided at both sides of the channel region and surround the latter to provide for example a double gate FinFET. Inversion channels are induced in the fin at both sides of the gate. The channel region in the fin has a small thickness so that the whole channel region is controlled by the gate, as a result of which, the short channel effect is suppressed.

However, in a conventional FinFET, the gate is provided between the source and the drain regions and extends parallel thereto. Since the distance between the source/drain regions and the gate is typically small enough for a capacitive couple introduced therebetween, the resultant device has a large parasitic resistance and capacitance.

Moreover, the capacitive coupling between the source/drain regions and the gate limits the freedom of device design. For example, if one attempts to reduce a parasitic resistance, the thickness of the source/drain regions should be increased.

However, the source/drain regions having a larger thickness also means an increased coupling area between the source/drain regions and the gate, which in turn causes the parasitic capacitance to increase, or vice versa. Thus, one skilled person in the art can not reduce both of the parasitic resistance and the parasitic capacitance together in a conventional FinFET.

Consequently, the conventional FinFET has a delay due to a large value of the time constant RC and thus has a low switching speed.

Moreover, the FinFET formed on a SOI has the disadvantage of having a much higher manufacturing costs than that of a FinFET formed on a bulk semiconductor substrate.

SUMMARY OF THE INVENTION

One object of the present invention is to provide a semiconductor device which is formed on a bulk semiconductor substrate, and is capable of suppressing the short channel effect while reducing the parasitic resistance and capacitance.

Another object of the present invention is to provide a semiconductor device which has improved electrical properties due to the induced stress.

According to one aspect of the invention, there is provided a semiconductor device comprising a fin of semiconductive material formed from a semiconductor layer over a semiconductor substrate and having two opposing sides perpendicular to the main surface of the semiconductor substrate; a source region and a drain region provided in the semiconductor substrate adjacent to two ends of the fin and being bridged by the fin; a channel region provided at the central portion of the fin; and a stack of gate dielectric and gate conductor provided at one side of the fin, wherein the gate conductor is isolated from the channel region by the gate dielectric, and wherein the stack of stack of gate dielectric and gate conductor extends away from the one side of the fin in a direction parallel to the main surface of the semiconductor substrate, and is insulated from the semiconductor substrate by an insulating layer.

According to another aspect of the invention, there is provided a method for manufacturing a semiconductor device, comprising steps of: a) providing a fin of semiconductive material in a semiconductor layer over a semiconductor substrate by a self-alignment process, the fin having two opposing sides perpendicular to the main surface of the semiconductor substrate; b) providing a stack of gate dielectric and gate conductor on one side of the fin, the gate conductor extending away from the one side of the fin in a direction parallel to the main surface of the semiconductor substrate and insulated from the semiconductor substrate by an insulating layer; c) doping the semiconductor substrate adjacent to the two ends of the fin so as to provide a source region and a drain region, the source region and drain region being bridged by the fin; and d) providing a channel region at the central portion of the fin.

It should be noted that the inventive semiconductor device includes a fin of semiconductive material but has a structure different from that of the conventional FinFET, because the gate according to the present invention is provided at only one side of the fin and extends away therefrom. As a comparison, the conventional FinFET typically has a double gate structure which surrounds a channel region at the central portion of fin. Moreover, in the present invention, the source/drain regions are provided just adjacent to the two ends of the fin and extend in a direction opposite to the direction in which the gate extends.

Since in the inventive semiconductor device the gate does not extend between the source/drain regions parallel thereto, there is no capacitive coupling between the source/drain regions and the gate. Thus, the inventive semiconductor device has a reduced parasitic capacitance. Meanwhile, the inventive semiconductor device allows a reduced parasitic resistance by providing source/drain regions having a relatively larger thickness.

Moreover, the inventive semiconductor device uses a conventional semiconductor substrate, instead of an expensive SOI wafer, where source and drain regions are provided, and a channel region is provided in a fin formed from a semiconductor layer over the semiconductor substrate. By using a conventional semiconductor layer, instead of the SOI wafer, the inventive semiconductor device has a reduced manufacturing costs.

The inventive semiconductive device also allows further suppression of the parasitic effect relevant with the parasitic capacitance and the parasitic resistance by providing extensions adjacent to the channel region in the fin so as to decrease the length of electrical conduction of the charge carriers.

Moreover, the inventive semiconductive device can have an increased switching speed by providing stressors for the source/drain regions so as to induce stress in the channel region.

For the purpose of effectively controlling the short channel effect, the channel region is provided with self-aligned process and has a small thickness, for example in the range of 5-40 nm. Preferably, a supper steep retrograde well (SSRW) is used so as to decrease the thickness of the channel region. Even in a case where the gate is provide at only one side of the fin, the gate can completely control the channel region and suppress the short channel effect.

DETAILED DESCRIPTION OF PREFERRED EMBODIMENTS

Figure 1A:
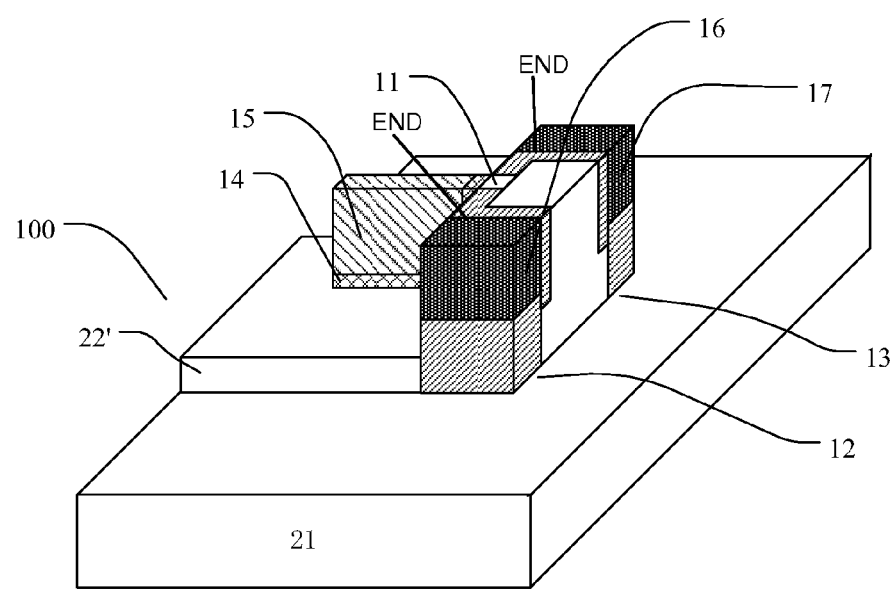
FIGS. 1A and 1B are a perspective view and a top view respectively of a structure of a semiconductor device according to an embodiment of the present invention, wherein the top view shows lines A-A', 1-1' and 2-2' for taking cross sections of the following figures.

Exemplary embodiments of the present invention are described in detail below with reference to the accompanying drawings. In the drawings, like reference numerals denote like members. The figures are not drawn to scale, for the sake of clarity.

It should be understood that when one layer or region is referred to as being "above" or "on" another layer or region in the description of device structure, it can be directly above or on the other layer or region, or other layer(s) or region(s) may be intervened therebetween. Moreover, if the device in the figures is turned over, the layer or region will be "under" or "below" the other layer or region.

In contrast, when one layer is referred to as being "directly on" or "on and adjacent to" another layer or region, there are not intervening layers or regions present.

Some particular details of the invention will be described, such as an exemplary structure, material, dimension, process step and fabricating method of the device, for a better understanding of the present invention. Nevertheless, it is understood by one skilled person in the art that these details are not always essential but can be varied in a specific implementation of the invention.

Unless the context clearly indicates otherwise, each part of the semiconductor device can be made of material(s) well-known to one skilled person in the art. As an initial structure, a semiconductor substrate is made of for example the group IV semiconductor (such as silicon, germanium) or group III-V semiconductor (such as gallium arsenide). A gate conductor can be for example a metal layer, a doped polysilicon layer, or a multilayer gate conductor including a metal layer and a doped polysilicon layer. The metal layer is made of one material selected from the group consisting of TaC, TiN, TaTbN, TaErN, TaYbN, TaSiN, HfSiN, MoSiN, RuTax, NiTax, MoN$_x$, TiSiN, TiCN, TaAlC, TiAlN, TaN, PtSi$_x$, Ni$_3$Si, Pt, Ru, Ir, Mo, Hf Ru, RuO$_x$, and their combination. A gate dielectric is made of SiO$_2$ or other dielectric insulation material which has a dielectric constant larger than that of SiO$_2$, such as an oxide, a nitride, an oxynitride, a silicate, an aluminate, and a titanate. The oxide includes for example SiO$_2$, HfO$_2$, ZrO$_2$, Al$_2$O$_3$, TiO$_2$, and La$_2$O$_3$. The nitride includes for example Si$_3$N$_4$. The silicate includes for example HfSiO$_x$. The aluminate includes for example LaAlO$_3$. The titanate includes for example SrTiO$_3$. The oxynitride includes for example SiON. Moreover, the gate dielectric can be made of those developed in the future, besides the above known materials.

Figure 1B:
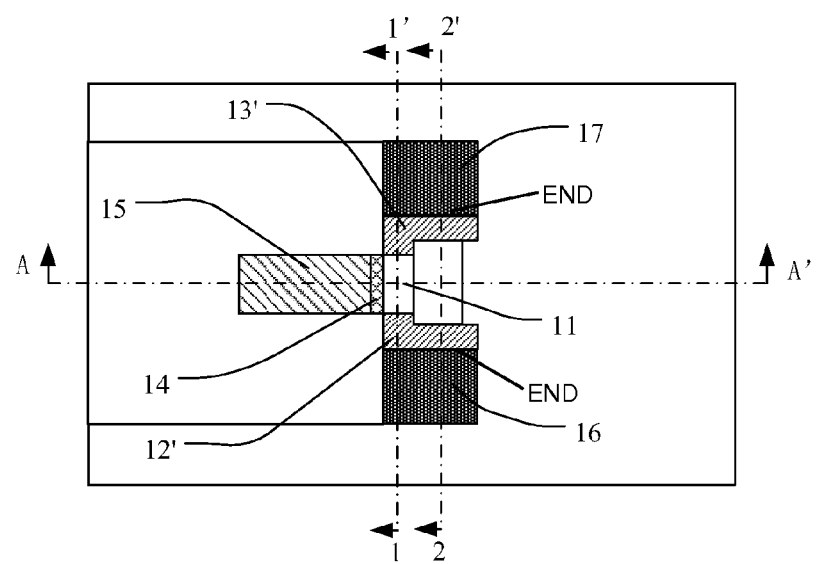

FIGS. 1A and 1B are perspective and top views respectively of a structure of a semiconductor device according to an embodiment of the present invention. Lines A-A', 1-1' and 2-2' in FIG. 1B indicate where the following cross-sectional views are taken. Specifically, line A-A' is perpendicular to a length direction of a channel region and goes through a gate, line 1-1' is parallel to the length direction of the channel region and goes through the channel region, and line 2-2' is also parallel to the length direction of the channel region but goes through the insulating filler between source/drain regions.

Referring to FIGS. 1A and 1B, a semiconductor device 100 is formed on a semiconductor substrate 21, which comprises a channel region 11 at the central portion of a fin of semiconductive material, a source region 12 and a drain region 13 in the semiconductor substrate 21 and adjacent to two ends of the fin, a stack of a gate conductor 15 and a gate dielectric 14 disposed adjacent to one side of the fin, and an insulating filler for filling a trench at the other side of the fin. The fin bridges the source region 12 and the drain region 13. The stack of the gate dielectric 14 and the gate conductor 15 extends away from the one side of the fin in a direction parallel to the main surface of the semiconductor substrate 21, being insulated from the semiconductor substrate 21 by an insulating layer 22' (for example, an oxide layer).

The channel region at the central portion of the fin has relatively small thickness, for example in a range of about 5-40 nm. The thickness of the channel region is approximately equal to that of the conventional FinFET and provided by a similar self-aligned process.

The inventor has found that the gate at one side of the fin, instead of a double gate configuration, can still control the whole channel region and thus suppress the short channel effect if the thickness of the channel region is set to be in the above range. Preferably, the semiconductor device further includes stressors 16, 17 which apply stress to the channel region 11. The stressors 16, 17 are disposed either directly on the source region 12 and the drain region 13, or with a conductive contact layer interposed therebetween.

The stressors 16, 17 are made of a material inducing a stress in the channel region, which has beneficial effect on electrical property of the transistor. In a case of an n-type MOSFET, the stressors 16, 17 should apply tensile stress towards the channel region in a direction parallel to the source and drain regions so as to maximize mobility of electrons which function as charge carriers. On the other hand, in a case of a p-type MOSFET, the stressors 16, 17 should apply compressive stress towards the channel region in a direction parallel to the source and drain regions so as to maximize mobility of holes which function as charge carriers.

It should be noted that the exemplary structure of the semiconductor device shown in FIGS. 1A and 1B includes stressors 16, 17 located in conduction paths between the source region 12 and a source contact (not shown), and between the drain region 13 and a drain contact (not shown). Thus, the stressors 16, 17 are also electrically conductive. For an n-type MOSFET, Si:C doped with As or P can be to used as a material of the stressors. For a p-type MOSFET, SiGe doped with B can be used as a material of the stressors.

Additional layers and portions of the semiconductor device, which are disposed above the source region 12, the drain region 13 and the gate 15, are not shown in FIGS. 1A and 1B, such as gate spacers, a silicide layer, a source contact, a drain contact, a gate contact, an interlayer insulator and vias formed therein, and a passivation layer.

In the following contents regarding the process steps of fabricating the semiconductor device, some of the above additional layers and portions related to the semiconductor device will be described, but detailed description of those additional layers or portions (for example a source contact, a drain contact, and a gate contact) well known to one skilled person are omitted. For simplicity, the structure of the semiconductor device having been subjected to several relevant process steps may be shown in one figure.

Figure 2:
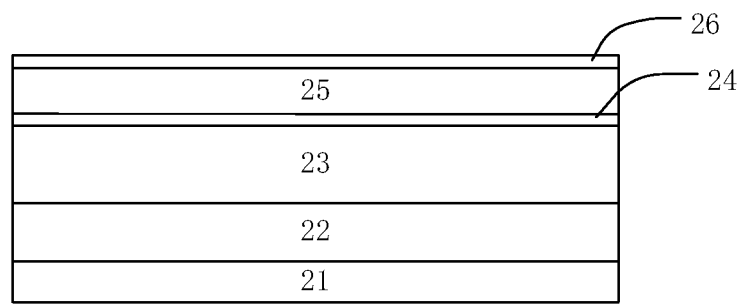
FIGS. 2-9 are cross-sectional views of the structure of the semiconductor device at various stages of fabrication process according to an embodiment of the present invention, taken along line A-A' and for illustrating the process steps of forming a fin and a gate.

Referring to FIG. 2, a method of manufacturing semiconductor device according to an embodiment of the present invention starts with a semiconductor wafer, such as a silicon wafer.

By a conventional deposition process, such as CVD, atomic layer deposition, sputtering and the like, a first SiGe layer 22 which has a Ge content of about 3-7% and a thickness of about 20-50 nm, a first Si layer 23 which has a thickness of about 50-150 nm, a second SiGe layer 24 which has a Ge content of about 5-20% and a thickness of about 3-20 nm, and a second Si layer 25 which has a thickness of about 30-100 nm, are epitaxially grown in this order on the semiconductor substrate 21. The Si layer can be formed either in an independent deposition process or in-situ by using a Si target or a precursor in the same chamber after the SiGe layer is epitaxially grown.

Then, a HfO$_2$ layer 26 which has a thickness of about 3-10 nm is formed on the second Si layer 25 by atomic layer deposition or magnetron sputtering.

Figure 3:
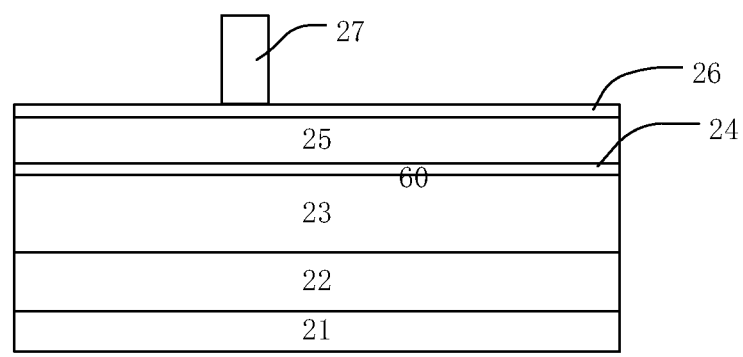

Referring to FIG. 3, by a conventional lithographical process including exposure and development steps, a photoresist pattern 27 in form of a stripe is formed on the HfO$_2$ layer 26.

Figure 4:
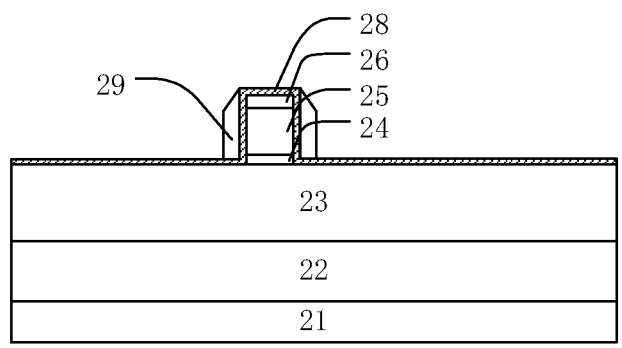

Referring to FIG. 4, with the photoresist pattern 27 as a mask, portions of the HfO$_2$ layer 26, the second Si layer 25, and the second SiGe layer 24 are selectively removed by dry etching such as ion beam milling, plasma etching, reactive ion etching, laser ablation and the like, so as to provide a stacked structure of the HfO$_2$ layer 26, the second Si layer 25, and the second SiGe layer 24 in a stripe pattern. Two steps may be involved if the reactive ion etching is performed. At the first step, the portions of the HfO$_2$ layer 26 and the second Si layer 25 are selectively removed with the second SiGe layer 24 as a stop layer, by choosing a suitable gas in an etching atmosphere. At the second step, a portion of the second SiGe layer 24 is further selectively removed with the first Si layer 23 as a stop layer, by changing to another type of gas in the etching atmosphere. It is well known to one skilled person that one of the SiGe layer and the Si layer can be selectively removed by controlling etch selectivity with a different type of gas in an etching atmosphere being used in the reactive ion etching process.

Then, the photoresist pattern 27 is removed by ashing or dissolution with a solvent. A conformal thin oxide layer 28 which has a thickness of about 2-5 nm is formed on the stacked structure in the stripe pattern and on an exposed portion of the first Si layer 23.

The thin oxide layer 28 can be formed by a conventional deposition process, such as CVD, atomic layer deposition, sputtering and the like.

Then, a conformal nitride layer is firstly formed and then has a portion thereof being removed so as to provide nitride spacers 29 which has a thickness of about 5-50 nm at both sides of the stacked structure comprising the HfO$_2$ layer 26, the second Si layer 25 and the second SiGe layer 24.

Figure 5:
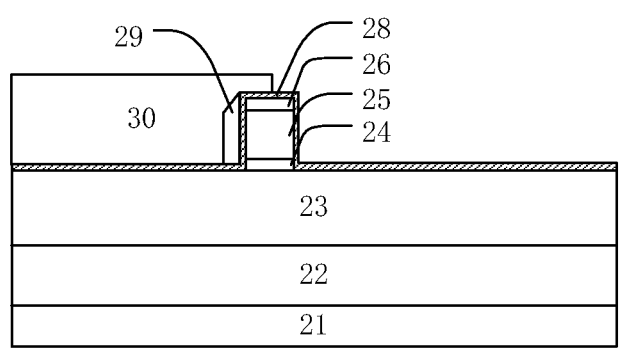

Referring to FIG. 5, by a conventional lithographical process including exposure and development steps, a photoresist pattern 30 is formed on the structure shown in FIG. 4 so as to mask the spacer at the left side of the stacked structure and its left portion.

Figure 6:
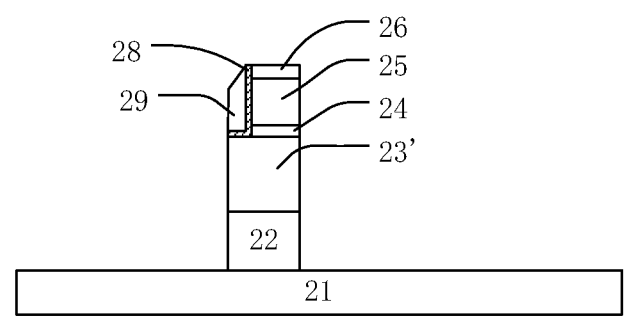

Referring to FIG. 6, with the photoresist pattern 30 as a mask, the spacer at the right side of the stacked structure is removed by an isotropic etching process, such as conventional wet etching using a solution of etchant.

Alternatively, the spacer at the right side of the stacked structure can be removed in three steps. At the first step, with the photoresist pattern 30 as a mask, an angular implantation of Ge is performed so as to cause damages in the spacer at the right side of the stacked structure. At the second step, the photoresist pattern 30 is removed by ashing or dissolution with a solvent. At the third step, by wet etching or dry etching, the spacer at the right side is selectively removed relative to the spacer at the left side.

After the spacer at the right side of the stacked structure is removed, the portion of the thin oxide layer 28 that is exposed on the main surface of the semiconductor structure is selectively removed by choosing a suitable gas in an etching atmosphere for example in an reactive ion etching.

Then, with the remaining portion of the thin oxide layer 28, the spacer 29 at the left side and the stacked structure comprising the HfO$_2$ layer 26, the second Si layer 25 and the second SiGe layer 24 as a hard mask, an exposed portion of the first Si layer 23 and the first SiGe layer 22 is selectively removed by changing to another type of gas in the etching atmosphere for example in the reactive ion etching, so as to provide a fin 23' of semiconductive material from the first Si layer 23 in a self-aligned manner and expose a portion of the main surface of the semiconductor substrate 21.

Figure 7:
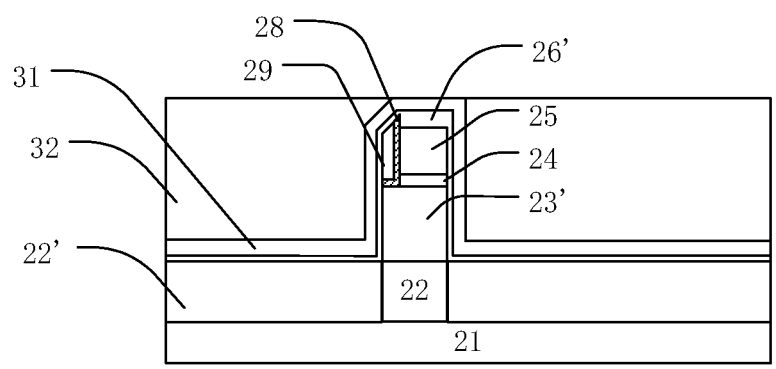

Referring to FIG. 7, an oxide is firstly provided on the semiconductor structure shown in FIG. 6 by HDP (highdensity plasma), and then etched back. Because the portion of oxide on an exposed surface of the semiconductor substrate 21 has a thickness larger than the thicknesses of other portions, etch back may be controlled to leave an insulating layer 22' only on the exposed surface of the semiconductor substrate 21.

Then, for example by CVD or atomic layer deposition, a conformal thin oxide (for example, $HfO_2$) layer 26' which has a thickness of about 2-4 nm, a conformal metal (for example, TiN, which is a metal ceramic) layer 31 which has a thickness of about 3-10 nm, and a blanket polysilicon layer 32 are formed in this order on the whole surface of the semiconductor structure. The conformal thin oxide layer 26' will provide a gate dielectric, and the conformal metal layer 31 and the polysilicon layer 32 constitutes a multi-layered gate conductor.

Preferably, the polysilicon layer 32 can be in-situ doped so as to improve electrical conductivity.

The polysilicon layer 32 covers the whole top of the semiconductor structure. Then, the polysilicon layer 32 is subjected to a planarization process such as chemical mechanical polishing (CMP). The CMP stops at the top of the metal layer of the multilayer gate conductor so as to provide a flat surface for the semiconductor structure.

Figure 8:
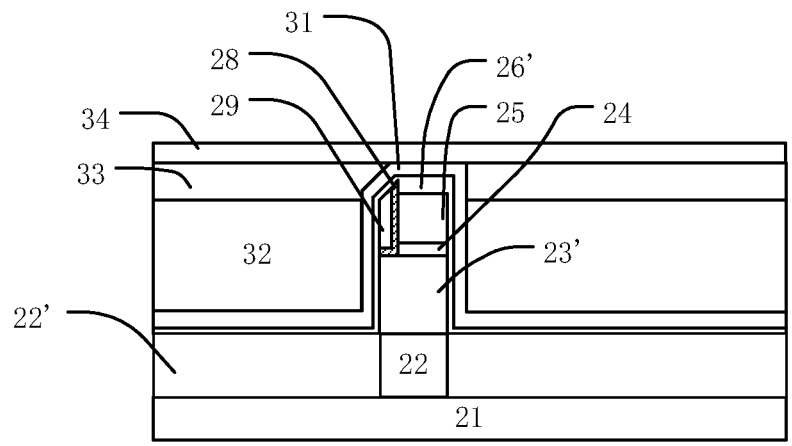

Referring to FIG. 8, by wet etching or dry etching, a portion of the polysilicon layer 32 is selectively removed relative to the metal layer 31 so that the polysilicon layer 32 is etched back. Then, for example by CVD, a blanket oxide layer 33 is formed on the whole surface of the semiconductor structure.

The oxide layer 33 is subjected to CMP which stops at the top of the metal layer of the multilayer gate conductor so as to provide a flat surface for the semiconductor structure. Consequently, the oxide layer 33 fills the portion of the polysilicon layer 32 removed by etching back.

Then, for example by CVD, a nitride layer 34 is formed on the main surface of the semiconductor structure.

Figure 9:
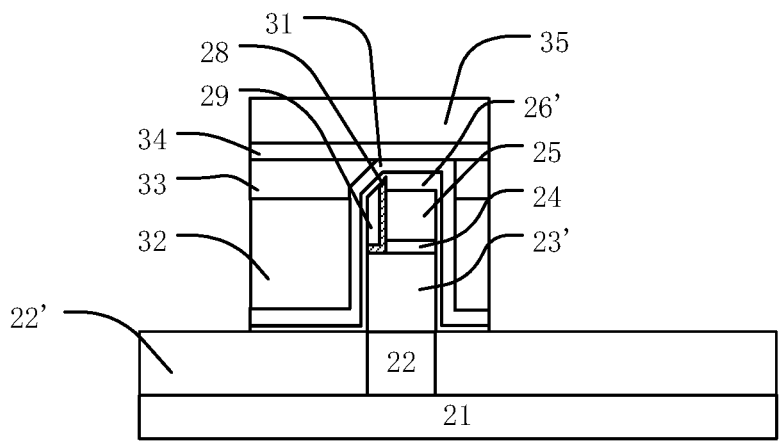

Referring to FIG. 9, by a conventional lithographical process including exposure and development steps, a photoresist pattern 35 in form of a stripe is formed for defining a gate region of the device. The multilayer gate conductor comprises the metal layer 31 and the polysilicon layer 32.

Then, with the photoresist pattern 35 as a mask and the insulating layer 22' as a stop layer, portions of the nitride layer 34, the oxide layer 33, the polysilicon layer 32, the metal layer 31 and the thin oxide layer 26' that are located outside of the fin 23' are removed in this order by dry etching, such as ion beam milling, plasma etching, reactive ion etching, laser ablation and the like.

Figure 10:
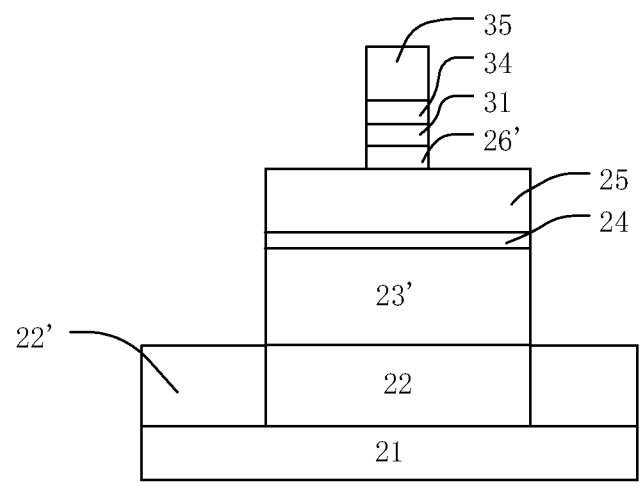
FIGS. 10-16 are cross-sectional views of the structure of the semiconductor device at various stages of the subsequent fabrication process according to an embodiment of the present invention, taken along line 1-1' and for illustrating the process steps of forming source/drain regions.

Corresponding to the cross sectional view of the semiconductor structure along line A-A' shown in FIG. 9, FIG. 10 shows the cross sectional view of the semiconductor structure along line 1-1'. In the etching step with the photoresist pattern 35 as a mask, a stack of the nitride layer 34, the oxide layer 33, the polysilicon layer 32, the metal layer 31, and the thin oxide layer 26' is provided on the second Si layer 25. Before or after the above etching step, an additional masking step and an additional etching step can be involved so as to remove portions of the fin 23', the second SiGe layer 24 and the second Si layer 25 for defining the length of the fin, with the insulating layer 22' as a stop layer. FIG. 10 shows the dimension of the length of the fin 23' in a horizontal direction after that.

Figure 11:
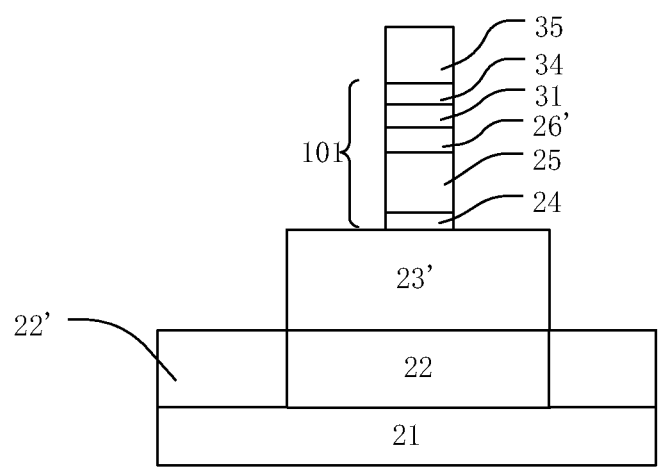

Referring to FIG. 11, still with the photoresist pattern 35 as a mask, portions of the second Si layer 25 and the second SiGe layer 24 are selectively removed in this order by dry etching such as ion beam milling, plasma etching, reactive plasma etching, laser ablation and the like, with the fin 23' as stop layer. Consequently, a stack 101 of layers including the nitride layer 34, the metal layer 31, the thin oxide layer 26', the second Si layer 25 and the second SiGe layer 24 is provided on the fin 23'.

Figure 12:
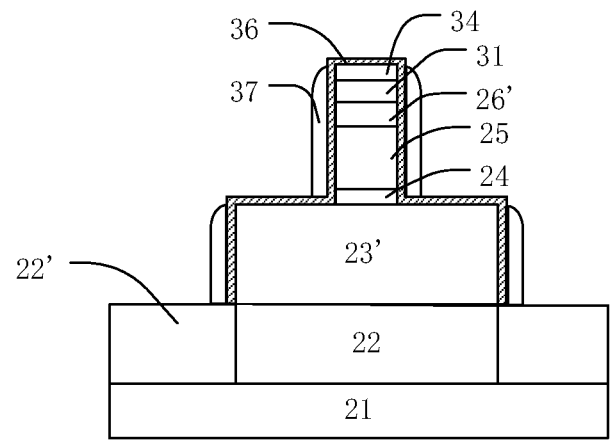

Referring to FIG. 12, the photoresist pattern 35 is removed by ashing or dissolution with a solvent.

Then, for example by CVD, a conformal oxide layer 36 which has a thickness of about 2-5 nm and a conformal nitride layer 37 which has a thickness of about 10-20 nm are formed in this order on the whole surface of the semiconductor structure.

By dry etching, such as ion beam milling, plasma etching, reactive ion etching, laser ablation and the like, a portion of the nitride layer 37 is removed, with the oxide layer 36 as a stop layer, so as to form nitride spacers 37 at both sides of the fin 23' and the stack of layers 101 respectively.

Figure 13:
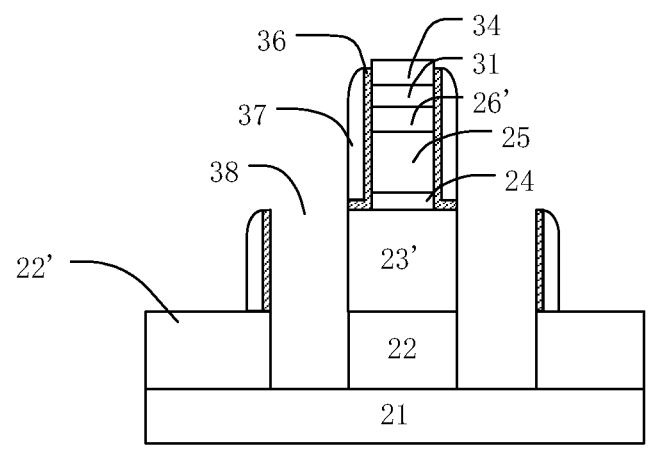

Referring to FIG. 13, with the stack of layers 101 and the nitride spacers 37 as a hard mask, an exposed portion of the oxide layer 36 and corresponding portions of the semiconductive material of the fin 23' and the first SiGe layer 22 are removed by dry etching, such as ion beam milling, plasma etching, reactive ion etching, laser ablation and the like, which stops on the top of the semiconductor substrate 21, so as to provide trenches 38 at two ends of the fin 23' in its length direction (i.e. a horizontal direction in the drawing).

The etching step is performed in a self-aligned manner, where the size of the trenches 38 is defined by the oxide layer 36 and the nitride spacers 37.

Figure 14:
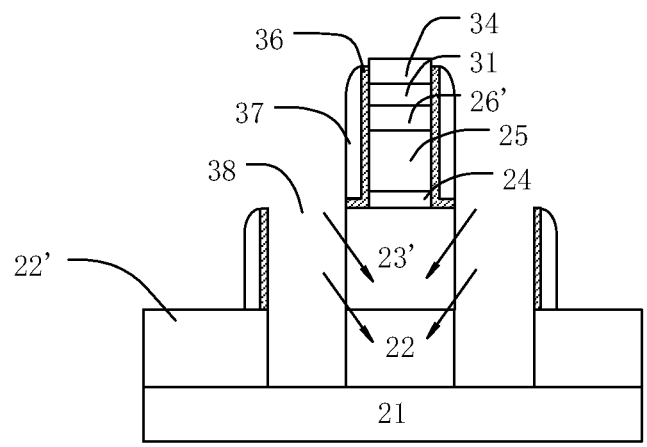

FIG. 14 shows an optional step of the manufacturing method according to some embodiments, in which an angular ion implantation is performed through the trenches 38 in the central portion of the fin 23' so as to provide halos in channel or in the substrate below the channel (i.e. a halo implantation). As a dopant for an n-type MOSFET, B or $BF_2$ may be used. As a dopant for a p-type MOSFET, As or P may be used.

Figure 15:
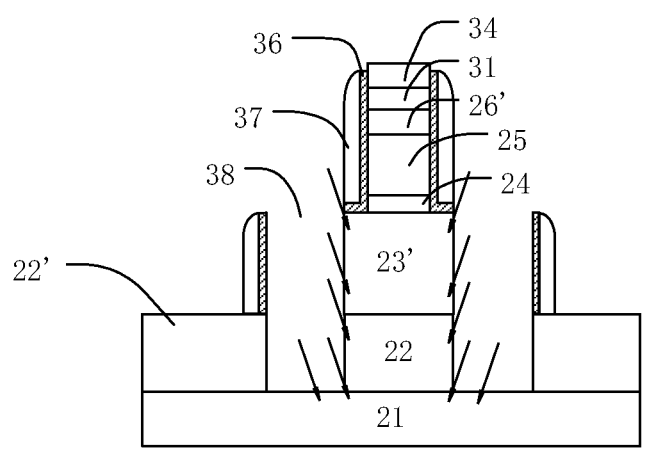

FIG. 15 shows an optional step of the manufacturing method according to some embodiments, in which an angular ion implantation is performed through the trenches 38 towards to the central portion of the fin 23' so as to provide source/drain extensions (i.e. an extension implantation). As a dopant for an n-type MOSFET, As or P may be used. As a dopant for a p-type MOSFET, B or $BF_2$ may be used.

Compared with the halo implantation, the extension implantation uses a relatively small implantation angle and a relatively large implantation energy. Consequently, in the extension implantation, most of the implanted ions pass through the thin layer of semiconductor material at the surface of the semiconductor substrate 21 so that no amorphous phase occurs in the thin layer of semiconductive material.

Since the trenches 38 provide a window for ion implantation, and the nitride layer 34, the oxide layer 36 and the nitride spacers 37 on the surface of the semiconductor structure provide a hard mask, the above extension implantation, halo implantation and the source/drain implantation can be performed in-situ, which reduces the number of masks needed and simplifies the process steps.

Figure 16:
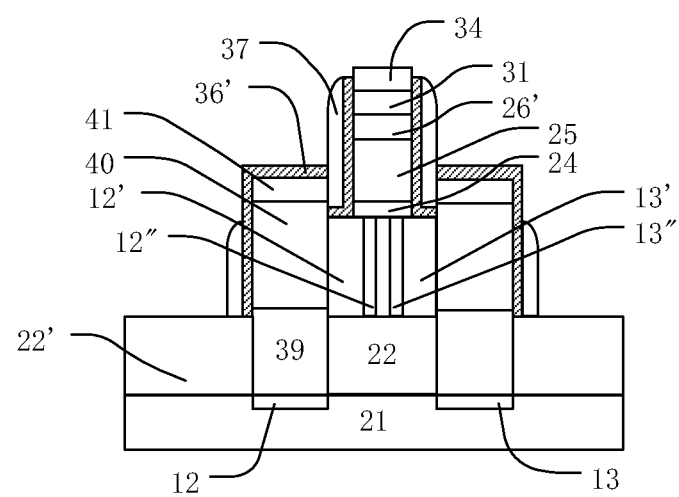

Referring to FIG. 16, the resultant semiconductor structure is subjected to an anneal treatment, for example spike anneal. The anneal treatment is used to activate the dopants injected at the previous implantation steps and to eliminate implant damages.

After the anneal treatment, the doping profile in the fin 23' of semiconductive material is also shown in FIG. 16, which includes a source region 12 and a drain region 13 provided in the thin layer of semiconductor material at the surface of the semiconductor substrate 21 that is exposed through the trenches 38, a source extension 12' provided in the fin 23' and adjacent to the source region 12, a drain extension 13' provided in the fin 23' and adjacent to the drain region 13, a source halo 12" provided in the fin 23' and adjacent to the source extension 12' and extending towards to the central portion of the fin 23', and a drain halo 13" provided in the fin 23' and adjacent to the drain extension 13' and extending towards to the central portion of the fin 23'.

Then, by a conventional deposition process, such as CVD, atomic layer deposition, sputtering and the like, a silicon contact layer 39, a stressor 40 and an epitaxial silicon layer 41 are epitaxially grown in this order in the trenches 38. The silicon contact layer 39 contacts the source region 12 and drain region 13 respectively, and provides conduction path to external electrodes. Due to the epitaxial growth, the silicon contact layer 39 is formed only on the surface of the semiconductor substrate 21 that is exposed through the trenches 38. For a p-type MOSFET, the silicon contact layer 39 is in-situ doped with P and has a thickness of about 10 nm, the stressor 40 is SiGe which has a Ge content of about 20-50% and is in-situ doped with B, and the epitaxial silicon layer 41 is in-situ doped with B. After epitaxial growth, compressive stress is applied towards the channel region in a direction parallel to the source and drain regions, which enhances the performance of the p-type MOSFET. For an n-type MOSFET, the silicon contact layer 39 is in-situ doped with B and has a thickness of about 10 nm, the stressor 40 is Si:C which has a C content of about 0.5-2% and is in-situ doped with As or P, and the epitaxial silicon layer 41 is in-situ doped with As or P. After epitaxial growth, tensile stress is applied towards the channel region in a direction parallel to the source and drain regions, which enhances the performance of the n-type MOSFET.

Then, the resultant semiconductor structure is subjected to oxidation so that the top of the epitaxial silicon layer 41 is oxidized and a thin oxide layer 36' which has a thickness of about 3-10 nm is formed. The epitaxial silicon layer 40 at the top of the stressors 40 is used to provide a high-quality $SiO_2$ layer.

Figure 17:
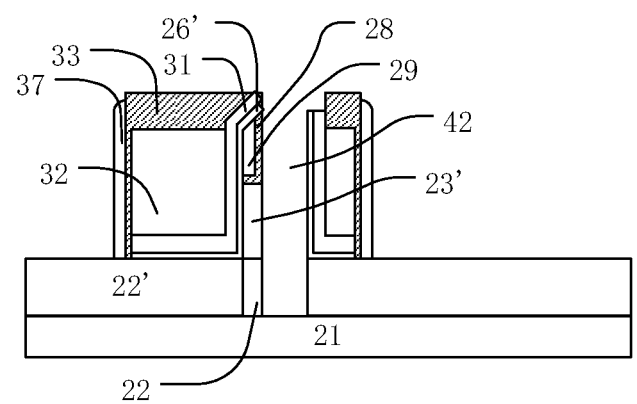
FIGS. 17-21 are cross-sectional views of the structure of the semiconductor device at various stages of the subsequent fabrication process according to an embodiment of the present invention, taken along line A-A' and for illustrating the process steps of forming a channel region.

Referring to FIG. 17, with the oxide layer 33 formed in the step shown in FIG. 8 as a hard mask and the semiconductor substrate 21 as a stop layer, portions of the metal layer 31, the thin oxide layer 26', the second Si layer 25, the second SiGe layer 24, the fin 23' and the first SiGe layer 22 are removed in this order by dry etching such as ion beam milling, plasma etching, reactive ion etching, laser ablation and the like, so as to provide a trench 42 in a self-aligned manner. Consequently, the thickness of the fin 23' is reduced to be approximately equal to a sum of the thickness of the oxide layer 28 and that of the nitride spacer 29. As mentioned above, the channel region is formed in the fin. Due to the removed materials in the trench, the stress induced in the channel region is enhanced so as to further improve an electrical property of the device.

At the right portion of the sidewall (i.e. a portion of the inner wall) of the trench 42, a portion of the stack of the thin oxide layer 26', the metal layer 31, the polysilicon layer 32 and the oxide layer 33 remains. In the manufacture of an integrated circuit including a plurality of MOSFETs having the same structure, the portion of the stack of the thin oxide layer 26', the metal layer 31, the polysilicon layer 32 and the oxide layer 33 at the right portion of the sidewall of the trench 42 may be used to provide a gate region for an adjacent MOSFET (not shown in FIG. 17), and the insulating filler in the trench 42 may provide a shallow trench isolation.

Moreover, as shown in FIG. 17, the nitride spacers 37 formed in the step shown in FIG. 12 remain at the sidewall of the multilayer gate conductor.

Figure 18:
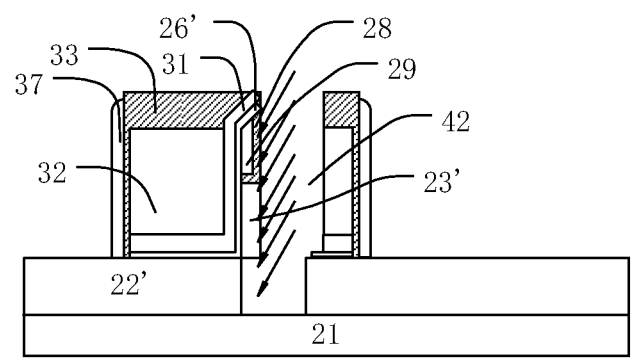

Referring to FIG. 18, by wet etching or dry etching in which SiGe is selectively removed relative to Si, the portion of the first SiGe layer 22 under the fin 23' is removed, and then by dry etching such as ion beam milling, plasma etching, reactive ion etching, laser ablation and the like, the portions of the thin oxide layer 26' and the metal layer 31 that remain at the sidewall (i.e. the right portion of the sidewall shown in FIG. 18) of the trench 41 are selectively removed relative to the oxide layer 33.

Preferably, ions are implanted into the fin 23' of semiconductive material by an angular ion implantation, followed by an anneal treatment (for example, laser anneal) for activating the dopants, so as to provide a super steep retrograde well (SSRW) 42 in the fin 23' at the side near the trench 42. The trench 42 provides a window for ion implantation. The process for forming SSRW can be found in the following documents:

1) G. G. Shahidi, D. A. Antoniadis and H. I. Smith, IEEE TED Vol. 36, p. 2605, 1989
2) C. Fiegna, H. Iwai, T. Wada, M. Saito, E. Sangiorgi and B. Riccó, IEEE TED Vol. 41, p. 941, 1994.
3) J. B. Jacobs and D. A. Antoniadis, IEEE TED Vol. 42, p. 870, 1995.
4) S. E. Thompson, P. A. Packan and M. T. Bohr, VLSI Tech Symp., p. 154, 1996.

Figure 19:
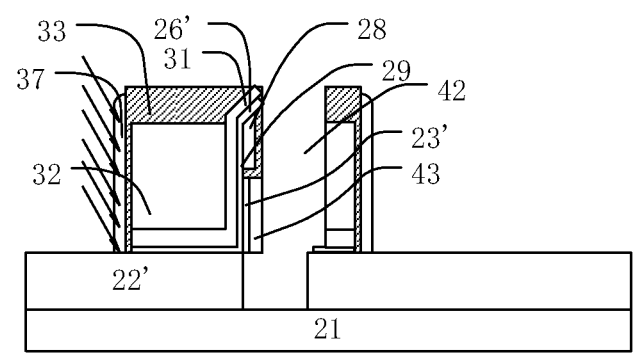
Figure 20:
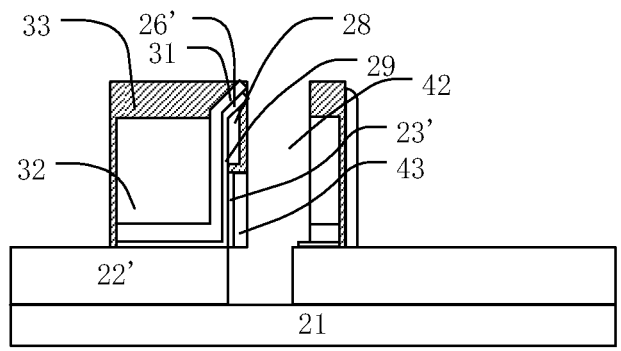

Referring to FIGS. 19 and 20, the spacer 37 on the left side can be removed in three steps. At the first step, with the oxide layer 33 as a mask, an angular ion implantation of Ge is performed so as to cause damages in the spacer at the left side, as shown in FIG. 19. At the second step, the photoresist pattern 30 is removed by ashing or dissolution with a solvent. At the third step, by wet etching or dry etching, the spacer at the left side is selectively removed relative to the spacer at the right side, as shown in FIG. 20.

Figure 21:
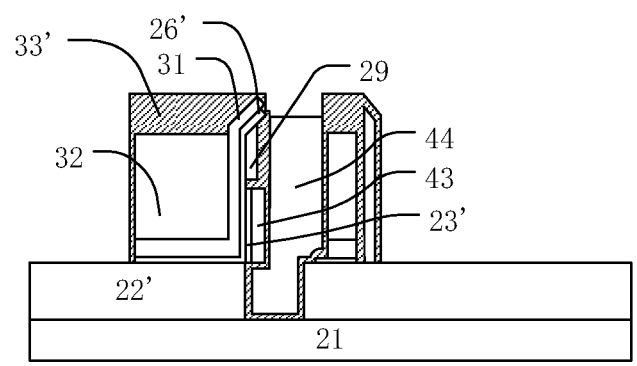

Referring to FIG. 21, for example by CVD, a conformal thin oxide layer 33' which has a thickness of about 2-5 nm is formed on the whole surface of the semiconductor structure. For example by CVD, a nitride is then deposited to a thickness sufficient for filling the trench 42. The nitride layer is selectively etched back relative to the oxide layer 33' so that the portion of the nitride layer around the trench 41 is completely removed and only the nitride filler 44 remains in the trench 41.

Figure 22A:
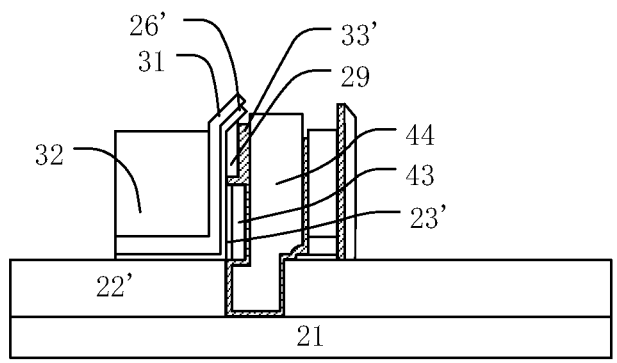
FIGS. 22A, 22B, 23A and 23B are cross-sectional views of the structure of the semiconductor device at various stages of the subsequent fabrication process according to an embodiment of the present invention, taken along line A-A' for FIGS. 22A and 23A, line 2-2' for FIGS. 22B and 23B, and for illustrating the process steps of forming a silicide layer on the source/drain regions and the gate.
Figure 22B:
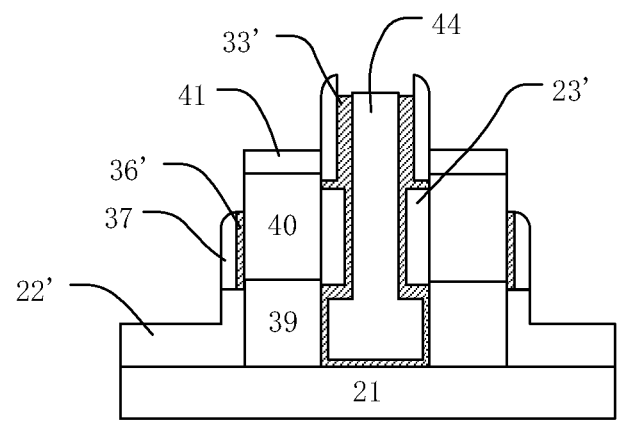

Referring to FIGS. 22A and 22B, by dry etching such as ion beam milling, plasma etching, reactive ion etching, laser ablation and the like, the oxide is selectively removed relative to the nitride filler 44.

The etching step removes completely the portion of the oxide layer 33' exposed at the main surface of the semiconductor structure, and the portion of the oxide layer 33' that is located at the sidewall and the bottom of the trench is protected by the nitride filler 44 and remains. Consequently, a top surface and a left side of the polysilicon layer 32 of the multilayer gate conductor, and a top surface of the epitaxial silicon layer 41 at the source/drain regions are exposed.

Figure 23A:
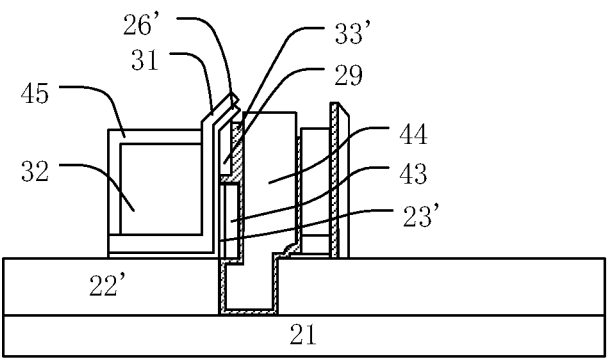
Figure 23B:
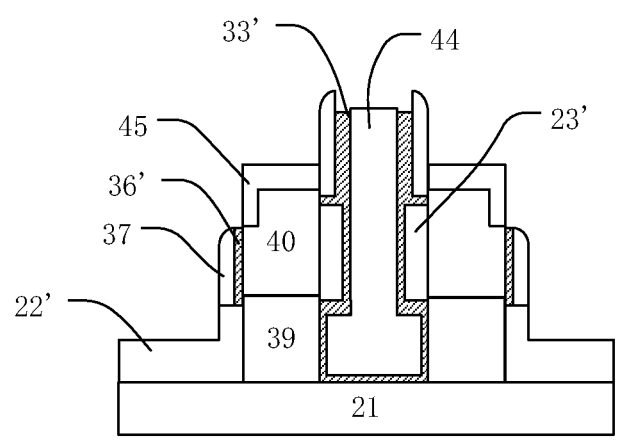

Referring to FIGS. 23A and 23B, by a conventional silicidation process, a portion of the top surface and the left side of the polysilicon layer 32 of the multilayer gate conductor, and at least a portion of the epitaxial silicon layer 41 at the source/drain regions are converted to a silicide layer 45, so as to minimize a contact resistance between the gates, the source/drain and the corresponding metal contacts.

For example, a Ni layer which has a thickness of about 5-12 nm is firstly deposited, and then subjected to a heat treatment at a temperature in a range of about 300-500 for about 1-10 seconds, so that at least a portion of the polysilicon layer 32 and the epitaxial silicon layer 41 is converted to NiSi. Finally, the unreacted Ni is removed by wet etching.

After the steps shown in FIGS. 2-23 are finished, an interlayer insulator may be formed on the resultant semiconductor structure, and vias may be provided therein, wirings and electrical contacts may be provided on an upper surface of the interlayer insulator according to conventional processes well known in the art, so that other parts of the semiconductor device are formed.

While the invention has been described with reference to specific embodiments, the description is illustrative of the invention. The description is not to be considered as limiting the invention. Various modifications and applications may occur for those skilled in the art without departing from the true spirit and scope of the invention as defined by the appended claims.

What is claimed is:

1. A semiconductor device, comprising
   a fin of semiconductive material formed from a semiconductor layer over a semiconductor substrate and having first and second opposing sides perpendicular to the main surface of the semiconductor substrate;
   a source region and a drain region provided in the semiconductor substrate adjacent to two ends of the fin and bridged by the fin;
   a channel region provided at the central portion of the fin;
   a stack of gate dielectric and gate conductor provided at the first side of the fin, wherein the gate conductor is isolated from the channel region by the gate dielectric; and
   an insulating filler provided between the channel region and the second side of the fin, wherein a recess is formed between the second side of the fin and the channel region, and the insulating filter is filled in the recess,
   wherein the stack of gate dielectric and gate conductor extends away from the first side of the fin in a direction parallel to the main surface of the semiconductor substrate, and is insulated from the semiconductor substrate by an insulating layer.

2. The semiconductor device according to claim 1, further comprising contact layers on the source region and the drain region.

3. The semiconductor device according to claim 1, further comprising a super steep retrograde well in the fin, which is adjacent to the channel region and near the second side of the fin.

4. The semiconductor device according to claim 1, wherein the channel region has a thickness in the range of 5-40 nm.

5. The semiconductor device according to claim 1, wherein the gate conductor is one selected from the group consisting of a metal layer, a doped polysilicon layer, and a stack of a metal layer and a doped polysilicon layer.

6. The semiconductor device according to claim 5, wherein the metal layer is made of one selected from the group consisting of TaC, TiN, TaTbN, TaErN, TaYbN, TaSiN, HfSiN, MoSiN, RuTax, NiTax, $MoN_x$, TiSiN, TiCN, TaAlC, TiAlN, TaN, $PtSi_x$, $Ni_3Si$, Pt, Ru, Ir, Mo, HfRu, $RuO_x$, and any combination thereof.

7. The semiconductor device according to claim 1, wherein the gate dielectric is made of one selected from the group consisting of $SiO_2$, $Si_3N_4$, $HfSiO_x$, $HfO_2$, $ZrO_2$, $Al_2O_3$, $TiO_2$, $La_2O_3$, $SrTiO_3$, $LaAlO_3$, and any combination thereof.

8. The semiconductor device according to claim 1, further comprising stressors which are provided respectively over the source region and the drain region and apply stress to the channel region.

9. The semiconductor device according to claim 8, wherein the stressors are made of SiGe or Si:C.

10. The semiconductor device according to claim 1, further comprising a source extension and a drain extension in the fin which are adjacent to the source region and the drain region and extend toward the channel region respectively.

11. The semiconductor device according to claim 10, further comprising a source halo and a drain halo in the fin which are adjacent to the source extension and the drain extension and extend toward the channel region respectively.

12. A method for manufacturing a semiconductor device, comprising steps of:
   a) providing a fin of semiconductive material from a semiconductor layer over a semiconductor substrate by a self-alignment process, the fin having first and second opposing sides perpendicular to the main surface of the semiconductor substrate;
   b) providing a stack of gate dielectric and gate conductor on the first side of the fin, the gate conductor extending away from the one side of the fin in a direction parallel to the main surface of the semiconductor substrate and insulated from the semiconductor substrate by an insulating layer;
   c) doping the semiconductor substrate adjacent to the two ends of the fin so as to provide a source region and a drain region, the source region and the drain region being bridged by the fin;
   d) providing a channel region at the central portion of the fin; and
   e) providing an insulating filler to fill a recess formed between the channel region and the second side of the fin.

13. The method according to claim 12, wherein step a) of providing the fin of semiconductive material comprises steps of:
   providing a stacked structure in a pattern on the semiconductor layer;
   providing a conformal oxide layer and a conformal nitride layer on the stacked structure and on the whole exposed surface of the semiconductor layer;
   selectively removing a portion of the conformal oxide layer and a portion of the conformal nitride layer so that a nitride spacer and a portion of the conformal oxide layer remains at one side wall of the stacked structure; and
   with the nitride spacer, the remaining portion of the conformal oxide layer, and the stacked structure as a hard mask, selectively removing a portion of the semiconductor layer so that the semiconductive material having a first thickness remains at the central portion of the fin.

14. The method according to claim 13, wherein step d) of providing the channel region comprises a step of:
   with the nitride spacer and the remaining portion of the conformal oxide layer as a hard mask, selectively removing a portion of the stacked structure and a portion of the fin of semiconductive material so that the semiconductive material having a second thickness as the channel region remains at the central portion of the fin.

15. The method according to claim 12, after step d) of providing the channel region, further comprising a step of:
   providing a super steep retrograde well adjacent to the channel region at the central portion and near the second side of the fin.

16. The method according to claim 12, wherein the gate conductor is one selected from the group consisting of a metal layer, a doped polysilicon layer, and a stack of a metal layer and a doped polysilicon layer.

17. The method according to claim 12, wherein between step c) of providing the source region and drain region and step d) of providing the channel region, the method further comprises a step of providing contact layers and stressors on the source region and the drain region so as to apply stress to the channel region.

18. The method according to claim 12, after step d) of providing the channel region, further comprising a step of:
   performing an extension implantation on the central portion of the fin by angled ion implantation so as to provide source and drain extensions.

19. The method according to claim 18, before the step of the extension implantation for the source and drain extensions, further comprising a step of:
   performing a halo implantation on the central portion of the fin by angled ion implantation so as to provide source and drain halos.

20. The method according to claim 19, wherein the extension implantation is performed at an implantation angle smaller than that in the halo implantation, with an implantation energy larger than that in the halo implantation.

* * * * *